United States Patent
Wagner et al.

(10) Patent No.: US 7,639,102 B2
(45) Date of Patent: Dec. 29, 2009

(54) RECONFIGURABLE DUPLEXING COUPLERS

(75) Inventors: Christoph Wagner, Linz (AT); Herbert Jaeger, Prambachkirchen (AT)

(73) Assignee: Infineon Technologies AG, Neubiberg (DE)

( * ) Notice: Subject to any disclaimer, the term of this patent is extended or adjusted under 35 U.S.C. 154(b) by 1 day.

(21) Appl. No.: 12/034,005

(22) Filed: Feb. 20, 2008

(65) Prior Publication Data

US 2009/0206945 A1 Aug. 20, 2009

(51) Int. Cl.
*H01P 5/22* (2006.01)
*H01P 1/10* (2006.01)
*H04B 1/44* (2006.01)

(52) U.S. Cl. .................. 333/120; 333/101
(58) Field of Classification Search .......... 303/101, 303/103, 104, 109, 112, 116, 117, 120, 1.1
See application file for complete search history.

(56) References Cited

U.S. PATENT DOCUMENTS

| | | | | | |
|---|---|---|---|---|---|
| 3,619,787 | A | * | 11/1971 | Salzberg | 455/327 |
| 3,624,508 | A | * | 11/1971 | Kach | 370/281 |
| 4,031,472 | A | * | 6/1977 | Shinkawa et al. | 455/327 |
| 4,420,839 | A | * | 12/1983 | Hogerheiden, Jr. | 455/327 |
| 4,654,887 | A | * | 3/1987 | Murphy et al. | 455/327 |
| 4,904,966 | A | | 2/1990 | Rubin | |

* cited by examiner

*Primary Examiner*—Dean O Takaoka
(74) *Attorney, Agent, or Firm*—Eschweiler & Associates, LLC

(57) ABSTRACT

A multi-port reconfigurable coupler includes a coupler and a switching system configured to selectively reconfigure multiple ports of the coupler for increased application flexibility and for efficiently transmitting and receiving radio-frequency signals. The multi-port reconfigurable coupler includes a transmit signal port, a termination port, a receive signal port, an antenna port, and a switching system configured to selectively couple the termination port to a predetermined termination potential based on information indicating one of a transmit only mode, and a receive only mode, and to decouple based on information indicating a transmit-receive mode.

25 Claims, 8 Drawing Sheets

--PRIOR ART--

| SWD FUNCTION | CONFIG. | TRX | TX | RX |
|---|---|---|---|---|
| TRANSMIT | SW1 | 0 | 0 | 1 |
| TERMINATION | SW2 | 0 | 1 | 1 |
| RECEIVE | SW3 | 0 | 1 | 0 |
| C1 | SW4 | 0 | 0 | 1 |
| C2 | SW5 | 0 | 1 | 0 |
| C3 | SW6 | 0 | 1 | 0 |
| C4 | SW7 | 0 | 1 | 0 |

RECONFIGURABLE DUPLEXING COUPLERS

BACKGROUND OF THE INVENTION

Many microwave and RF systems use couplers in order to separate transmit (TX) and receive (RX) signals or to sum two combined signals. Systems having couplers used in this dual role may be referred to as transmit-receive (TRX) systems. For example, such TRX systems are often used in automotive radar systems utilizing frequency modulated continuous wave (FMCW) radar.

These TRX systems require good isolation between the high-power transmit signal and the often very weak receive signals. Inherently, a coupler used as a duplexer with isolation has to have losses in order to be realizable according to traditional network theory. In this case, only half of the incoming power is fed to the output of the duplexer, while the other half is dissipated in a suitable termination.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

In one embodiment, a multi-port reconfigurable coupler is disclosed, comprising a transmit signal port, a termination port, a receive signal port, an antenna port. The coupler further comprises a switching system configured to selectively couple the termination port to a predetermined termination potential based on information indicating one of a transmit only mode, and a receive only mode, and to decouple based on information indicating a transmit-receive mode.

In one embodiment, a coupler comprises a coupling means operable to couple substantially all the power received at a transmit signal port to an antenna port in a transmit only mode, and couple substantially all the power received at the antenna port to a receive signal port in a receive only mode. The coupling means is further operable to dissipate a percentage of the power received at the transmit signal port at a termination element coupled to a termination port, and pass a percentage of the power received at the transmit signal port to the antenna port in a transmit-receive mode. Still further, the coupling means is operable to dissipate a percentage of the power received at the antenna port in the transmit signal port and to pass a percentage of the power received at the antenna port to the receive signal port in the transmit-receive mode. The coupler further comprises a switching means operable to reconfigure the coupling means by selectively coupling one or more of the transmit signal port, the antenna port, the receive signal port and the termination port to a predetermined potential based on information indicating one of the transmit-receive mode, the transmit only mode, and the receive only mode.

In one embodiment of the invention, a method for efficiently transmitting and receiving signals is disclosed using a multi-port reconfigurable coupler. In one embodiment, the method comprises coupling a receive signal port and a termination port to a predetermined potential based on information indicating a transmit only mode, coupling a transmit signal port and the termination port to the predetermined potential based on information indicating a receive only mode, and decoupling the transmit signal port, the receive signal port and the termination port from the predetermined potential based on information indicating a transmit-receive mode.

The following description and annexed drawings set forth in detail certain illustrative aspects and implementations of the invention. These are indicative of only a few of the various ways in which the principles of the invention may be employed.

DETAILED DESCRIPTION OF THE INVENTION

Figure 1:
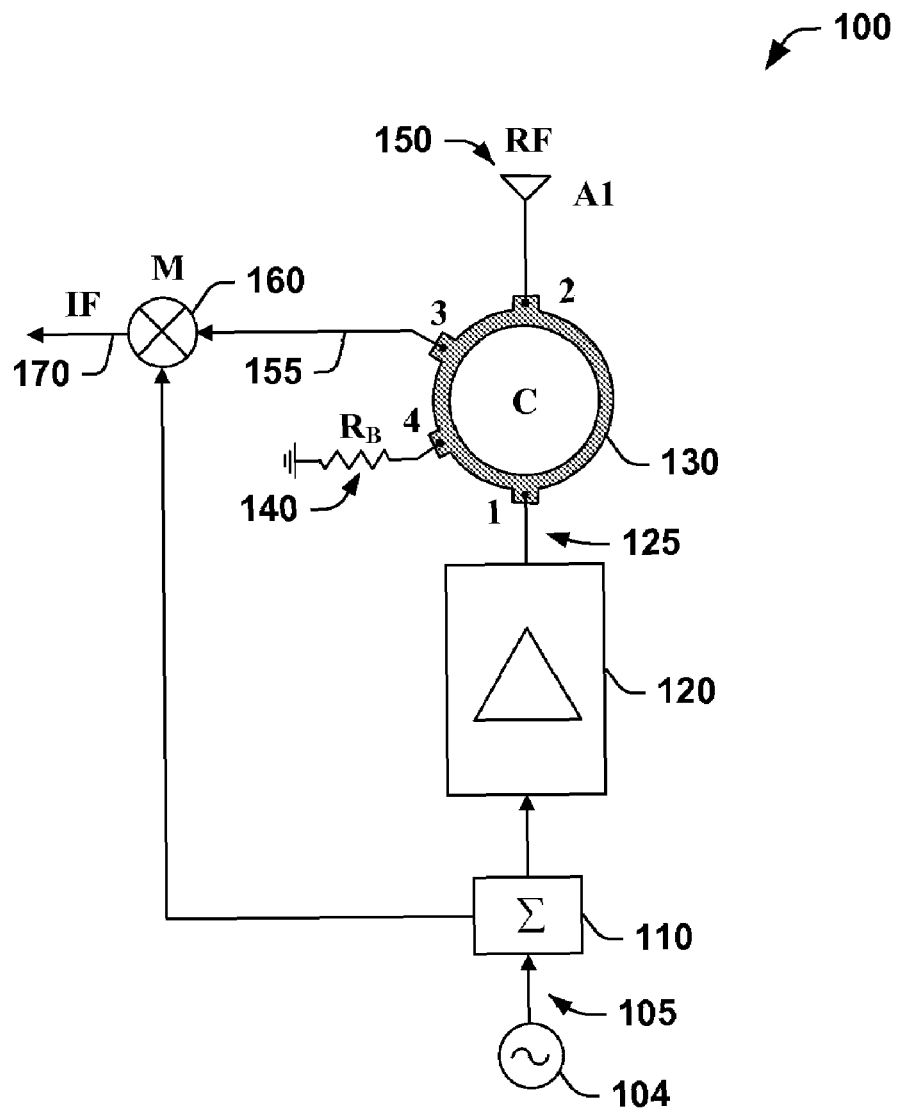
FIG. 1 is a simplified schematic diagram of a conventional automotive radar system.

One or more implementations of the present invention will now be described with reference to the attached drawings, wherein like reference numerals are used to refer to like elements throughout. The invention relates to systems and methods for selectively reconfiguring multiple ports of a coupler for increased application flexibility and for efficiently transmitting and receiving radio-frequency signals.

Currently, there is a desire to implement software reconfigurable systems. In the context of radar, this can mean that the functionality of the front-end of such a system can be switched from TRX to a TX or RX only system. This choice permits the system to either save transmission power or to provide for lower losses in the receive path respectively. The savings in the receive path are particularly desirable, since losses correspond directly to a noise figure in RX systems. Therefore, such reconfigurable couplers can improve the overall dynamic range. Furthermore, the number of TX/RX/TRX channels can be set by external means on-the-fly without the penalty of higher losses.

Duplexers with high isolation in the microwave frequency range are usually realized as couplers, either 90° or 180°, for example, branch line couplers, rat race couplers or Lange couplers. These structures as such, cannot be reconfigured on-the-fly, and therefore show the above mentioned losses between the inputs and outputs.

As indicated above, one such application for one or more couplers is in an automotive radar system. In microwave and millimeter-wave automotive radar systems, low cost and high performance radar is desirable. A typical radar system includes an oscillator, a divider, a power amplifier, a differential (or quadrature) hybrid coupler and an antenna. However, such a radar system is not very efficient since, for example, only half of an output power flows to the antenna, while the other half flows to the ballast resistor of the coupler.

FIG. 1 illustrates one conventional automotive radar system 100 for transmitting and receiving radar signals utilizing a single antenna so the entire size can be reduced. Radar system 100 comprises an oscillator 104 operable to supply a radio frequency (RF) signal 105 such as a millimeter wavelength signal. Radar system 100 further comprises a divider 110 which splits and drives the RF signal 105 to a power amplifier 120 and to a mixer (M) 160. The power amplifier 120 is used for amplifying and driving a radar transmission signal 125 into an antenna 150 and a ballast resistor 140, by way of a rat-race coupler or hybrid coupler 130. The mixer M 160 combines a received radar signal 155 from the antenna 150 by way of the coupler 130, with the original RF signal 105 by way of the divider 110, to provide an intermediate frequency (IF) signal 170. Thereafter, the IF signal 170 may be passed to a conventional radar detection system (not shown).

However, as indicated, the conventional radar system 100 of FIG. 1 is not very efficient, since only half (50%) of the output power of the radar transmission signal 125 flows to the antenna 150, while the other half flows to the ballast resistor 140 on the hybrid coupler 130.

In a complete practical automotive radar system, however, several transmitting and receiving paths with corresponding antennas and associated couplers are typically implemented to properly cover the monitored regions surrounding a car. Accordingly, another conventional radar system may comprise two separate transmitting and receiving antennas and respective couplers that may be configured such that half the transmission power is still lost in the ballast resistor of each system.

Accordingly, the multi-port reconfigurable coupler (or duplexer) of the present invention utilizes a conventional coupler structure and adds one or more components to the circuit in order to provide the reconfiguration capability. In particular, the synthesis of a microwave open/short circuit may be accomplished using microwave capable transistors, pin diodes, or other such RF switching devices, for example, particularly when implemented monolithically with the coupler itself on the same die.

Therefore, a reconfigurable coupler/duplexer can be provided in one embodiment of the invention by making changes with little impact on the layout of the coupler itself. The changes result in a coupler that has good isolation together with the resulting losses in a TRX system. At the same time, an RX-only system can be realized without the losses due to isolation requirements. Advantages over previous duplexer implementations are thereby provided.

One embodiment of the coupler of the present invention comprises a switching system comprising a combination of two switches configured between two nodes of a microwave coupler and a reference potential such as ground to provide a reconfigurable coupler. In one setting of the switches, a duplexer is provided (together with systematic losses in the receive path), and in another setting of the switches, these losses are minimized and the coupler is transformed into a configuration which provides a direct connection between the antenna and the mixer input.

Figure 2:
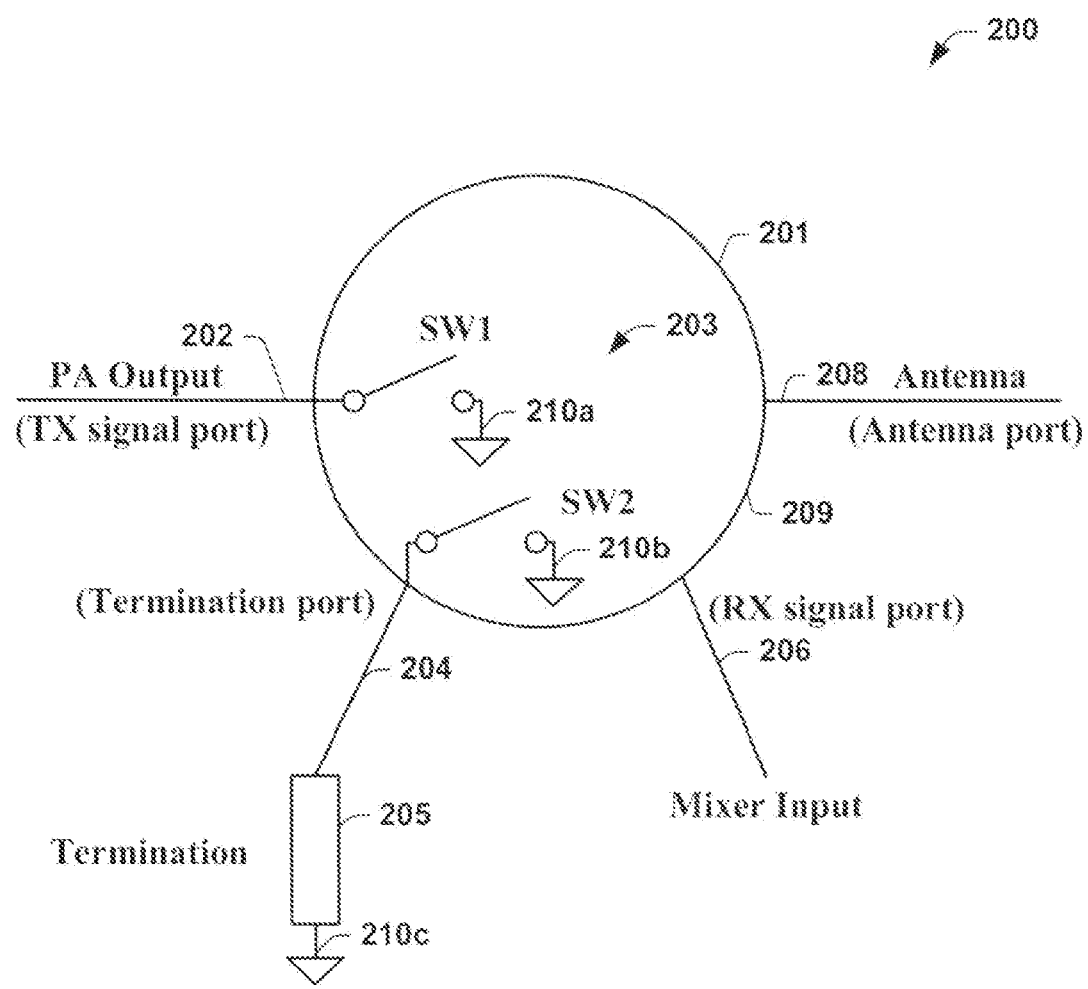
FIG. 2 is a simplified schematic diagram of a multi-port reconfigurable coupler in accordance with a first embodiment of the present invention.

Turning now to FIG. 2, a simplified schematic diagram of a multi-port reconfigurable coupler 200 is illustrated, in accordance with a first embodiment of the present invention. The multi-port reconfigurable coupler 200 utilizes a coupler or coupling device 201 and a switching system 203 comprising one or more switching components (e.g., switches SW1 and SW2, microwave capable transistors, pin diodes, or other such RF switching devices) for reconfiguring the coupling device 201, for example, in one of a transmit-receive mode (TRX) or a receive only mode (RX).

While the multi-port reconfigurable coupler 200 will be described herein with specified switches, coupling devices and various capacitive elements as one example, it should be understood that many variations of such components and features can be made, and all such variations are contemplated as falling within the scope of the present invention. For example, the switches SW1 and SW2 may be microwave capable transistors or any other such switching components controlled by, for example, transmit, receive, or transmit-receive mode select signals to reconfigure the multi-port coupler.

In particular, the first embodiment of the multi-port reconfigurable coupler 200, comprises a transmit (TX) signal port 202, for example, supplied by a power amplifier (PA) output, a termination port 204 typically connected to a suitable termination 205 such as a resistor coupled, for example, to a common or ground source 210c, a receive (RX) signal port 206, for example, typically feeding a mixer input, and an antenna port 208 connected to an antenna, for example.

Switching system 203 comprises the switch SW1 connected to the coupling device 201 at the TX signal port 202 and the switch SW2 connected to the coupling device 201 at the termination port 204. The switching component SW1 is configured to couple the TX signal port 202 to a transmit potential 210a, and switching component SW2 is configured to couple the termination port 204 to a termination potential 210b.

For example, when reconfigured with switches SW1 and SW2 open, the coupler 200 functions like a normal rat-race coupler in a transmit-receive (TRX) mode configuration. Configured in this manner, half the power from the PA output (at TX signal port 202) is split and fed to the antenna (at antenna port 208), and the other half of the power is dissipated in the termination 205 at termination port 204. The received power from the antenna (at antenna port 208) is split into a half power portion to the mixer input (at RX signal port 206) and the other half power portion is dissipated in the PA output (at TX signal port 202). This TRX configuration or mode results in a loss of 3 dB receive power ideally.

When reconfigured by closing switches SW1 and SW2, the coupler 200 functions in an improved receive-only (RX) mode configuration. Closing the switches SW1 and SW2 prevents the dissipation of power at the points where the switches SW1 and SW2 are connected to the coupler 200, and generates a reflection of the incident power at these nodes. Furthermore, the short circuit provided by the switches SW1 and SW2 is effectively transformed into an open connection at the antenna port 208 and the RX signal port 206. This configuration effectively isolates the antenna/mixer input interface from the entire coupler 200 as indicated in FIG. 3.

Figure 3:
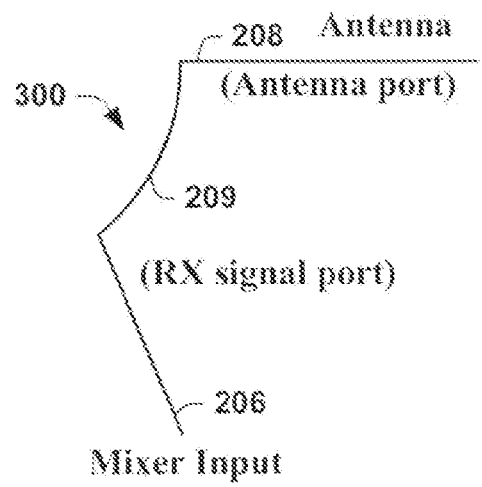
FIG. 3 is an equivalent circuit diagram of the multi-port reconfigurable coupler of FIG. 2 configured in the receive-only (RX) mode.

FIG. 3 illustrates an equivalent circuit diagram 300 of the multi-port reconfigurable coupler 200 of FIG. 2 configured in a receive-only (RX) mode. The RX-only mode (or simply RX mode) results in a much lower loss in the coupling device 201 in the coupler receive segment 209 between the antenna port 208 and the RX signal port 206 than in conventional couplers. A small loss of ideally ~0.5 dB is retained due to the mismatched line impedance in the coupling device 201. This line impedance mismatch can be compensated to some degree in one embodiment by optimization of the line impedances in the coupling device 201, by sacrificing the coupler performance in other design parameters.

Figure 4:
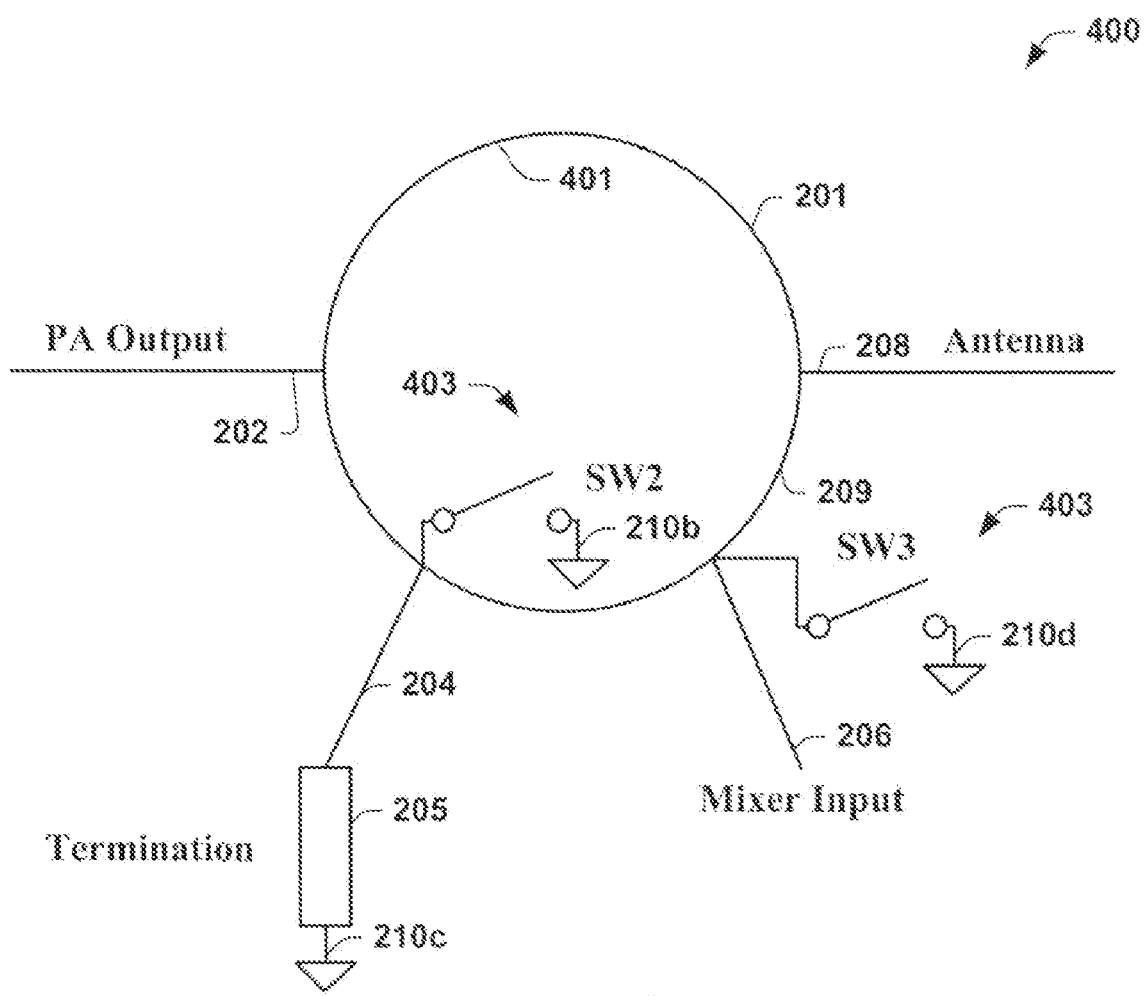
FIG. 4 is a simplified schematic diagram of another multi-port reconfigurable coupler in accordance with a second embodiment of the present invention.

FIG. 4 illustrates another exemplary multi-port reconfigurable coupler 300 utilizing a coupling device 201 and a switching system 203 comprising one or more switching components (e.g., switches SW2 and SW3) for reconfiguring the coupler 300 in one of a transmit-receive mode (TRX) or an improved transmit-only mode (TX), in accordance with a second embodiment of the present invention.

In particular, the second embodiment of the multi-port reconfigurable coupler 400, also comprises a transmit (TX) signal port 202, for example, supplied by a power amplifier (PA) output, a termination port 204 typically connected to a suitable termination 205 such as a resistor coupled, for example, to a common or ground source 210c, a receive (RX) signal port 206, for example, typically feeding a mixer input, and an antenna port 208 connected to an antenna, for example.

Switching system 403 comprises the switch SW2 connected to the coupling device 201 at the termination port 204 and the switch SW3 connected to the coupling device 201 at the RX signal port 206. The switching component SW2 is configured to couple the termination port 204 to a termination potential 210b, and switching component SW3 is configured to couple the RX signal port 206 to a receive potential 210d.

For example, when reconfigured with switches SW2 and SW3 open, the coupler 400 (as with coupler 200 of FIG. 2) functions like a normal rat-race coupler in a transmit-receive (TRX) mode configuration. Configured in this manner, half the power from the PA output (at TX signal port 202) is split and fed to the antenna (at antenna port 208), and the other half of the power is dissipated in the termination 205 at termination port 204. The received power from the antenna (at antenna port 208) is split into a half power portion to the mixer input (at RX signal port 206) and the other half power portion is dissipated in the PA output (at TX signal port 202). This TRX configuration or mode results in a loss of 3 dB receive power ideally.

Closing switches SW2 and SW3 reconfigures the coupler 400 into an improved transmit-only (TX) mode (or simply TX mode) configuration. Again, closing the switches SW2 and SW3 prevents the dissipation of power at the points where the switches SW2 and SW3 are connected to the coupler 400, and generates a reflection of the incident power at these nodes. Furthermore, the short circuit provided by the switches SW2 and SW3 is effectively transformed into an open connection at the antenna port 208 and the TX signal port 202. This configuration effectively isolates the antenna/PA output (transmit signal port 202) interface from the entire coupler 400 as indicated in FIG. 5.

Figure 5:
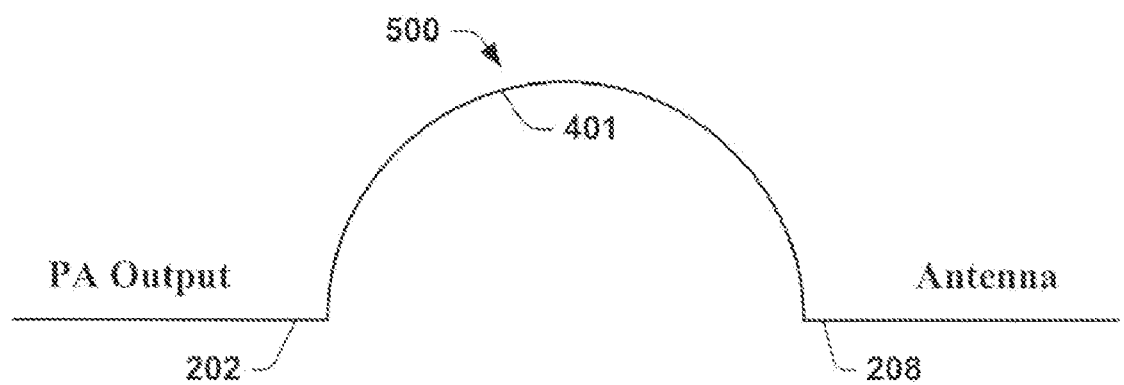
FIG. 5 is an equivalent circuit diagram of the multi-port reconfigurable coupler of FIG. 4 configured in the transmit-only mode (TX)

FIG. 5 illustrates an equivalent circuit diagram 500 of the multi-port reconfigurable coupler 400 of FIG. 4 configured in the improved transmit-only mode (TX). The TX-only mode results in a much lower loss in the coupling device 201 in the coupler transmit segment 401 between the antenna port 208 and the TX signal port 202 than in conventional couplers.

Figure 6:
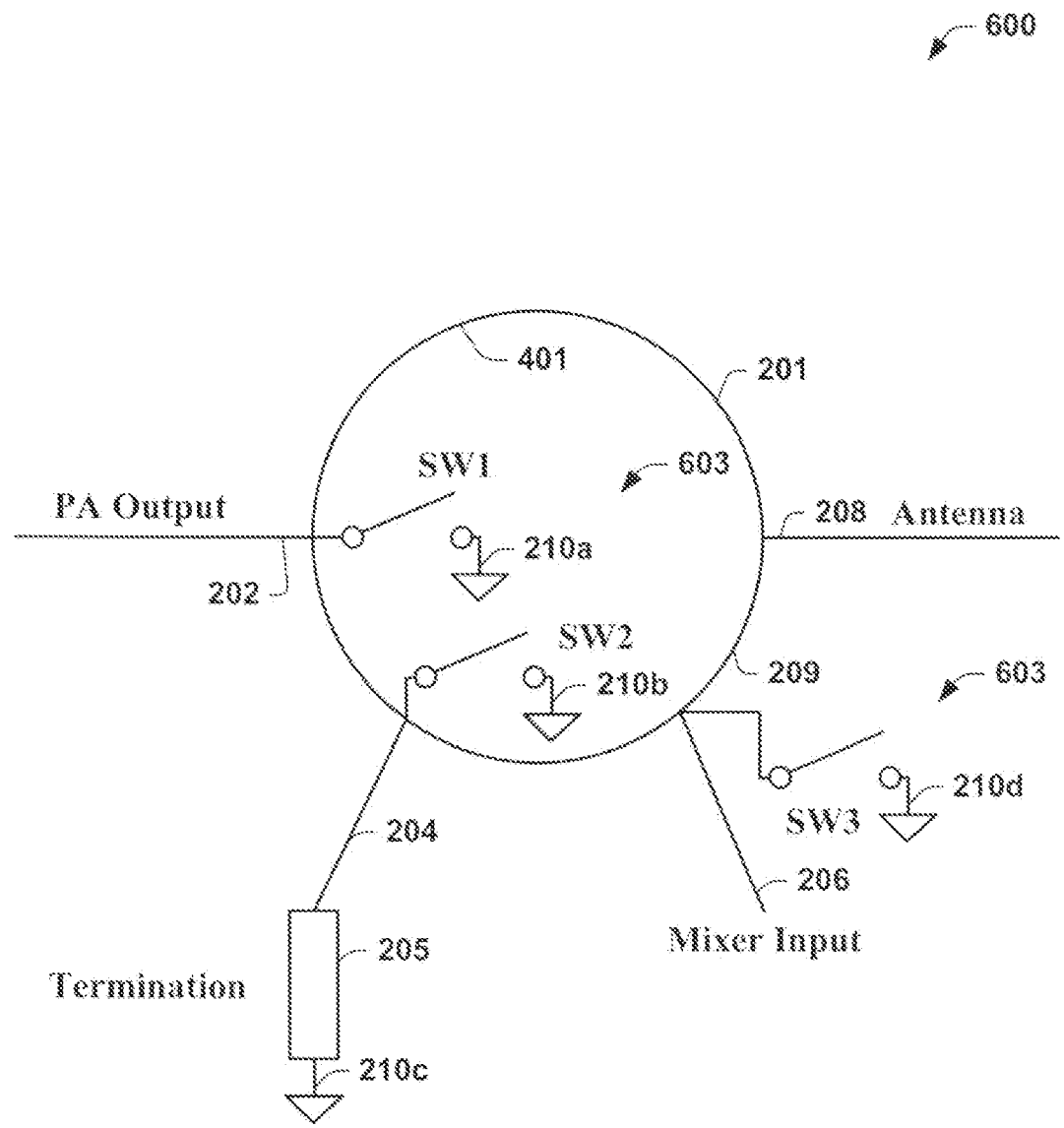
FIG. 6 is a simplified schematic diagram of a multi-port reconfigurable coupler in accordance with a third embodiment of the invention.

FIG. 6 illustrates an exemplary multi-port reconfigurable coupler 600 utilizing a coupling device 201 and a switching system 603 comprising one or more switching components (e.g., switches SW1, SW2 and SW3) for reconfiguring the coupling device 201 in one of a transmit-receive mode (TRX), an improved transmit-only (TX) mode or an improved receive-only (RX) mode, in accordance with a third embodiment of the invention. Thus, the third embodiment has the configuration flexibility and advantages mentioned above for both the first embodiment 200 of FIG. 2 and the second embodiment 400 of FIG. 4.

In particular, the third embodiment of the multi-port reconfigurable coupler 600 comprises a transmit (TX) signal port 202, for example, supplied by a power amplifier (PA) output, a termination port 204 typically connected to a suitable termination 205 such as a resistor coupled, for example, to a common or ground source 210c, a receive (RX) signal port 206, for example, typically feeding a mixer input, and an antenna port 208 connected to an antenna, for example.

Switching system 603 comprises the switch SW1 connected to the coupling device 201 at the TX signal port 202, the switch SW2 connected to the coupling device 201 at the termination port 204, and the switch SW3 connected to the coupling device 201 at the RX signal port 206. The switch SW1 is configured to couple the TX signal port 202 to a transmit potential 210a, the switch SW2 is configured to couple the termination port 204 to a termination potential 210b, and switch SW3 is configured to couple the RX signal port 206 to a receive potential 210d.

For example, when reconfigured with switches SW1, SW2 and SW3 opened, the coupler 600 (as with couplers 200 of FIG. 2 and 400 of FIG. 4) functions like a normal rat-race coupler in a transmit-receive (TRX) mode configuration, such as is discussed as above.

Closing switches SW1 and SW2 (with SW3 open) reconfigures the coupler 600 into an improved receive-only (RX) mode (or simply RX mode) configuration. Again, closing the switches SW1 and SW2 prevents the dissipation of power at the points where the switches SW1 and SW2 are connected to the coupler 600, and generates a reflection of the incident power at these nodes. Furthermore, the short circuit provided by the switches SW1 and SW2 is effectively transformed into an open connection at the antenna port 208 and the RX signal port 206. This configuration effectively isolates the antenna/mixer input interface from the entire coupler 600 as indicated in FIG. 3.

Closing switches SW2 and SW3 (with SW1 open) reconfigures the coupler 600 into an improved transmit-only (TX) mode (or simply TX mode) configuration. Again, the short circuit provided by the switches SW2 and SW3 is effectively transformed into an open connection at the antenna port 208 and the TX signal port 202. This configuration effectively isolates the antenna/PA output (transmit signal port 202) interface from the entire coupler 600 as indicated in FIG. 5.

Figure 7:
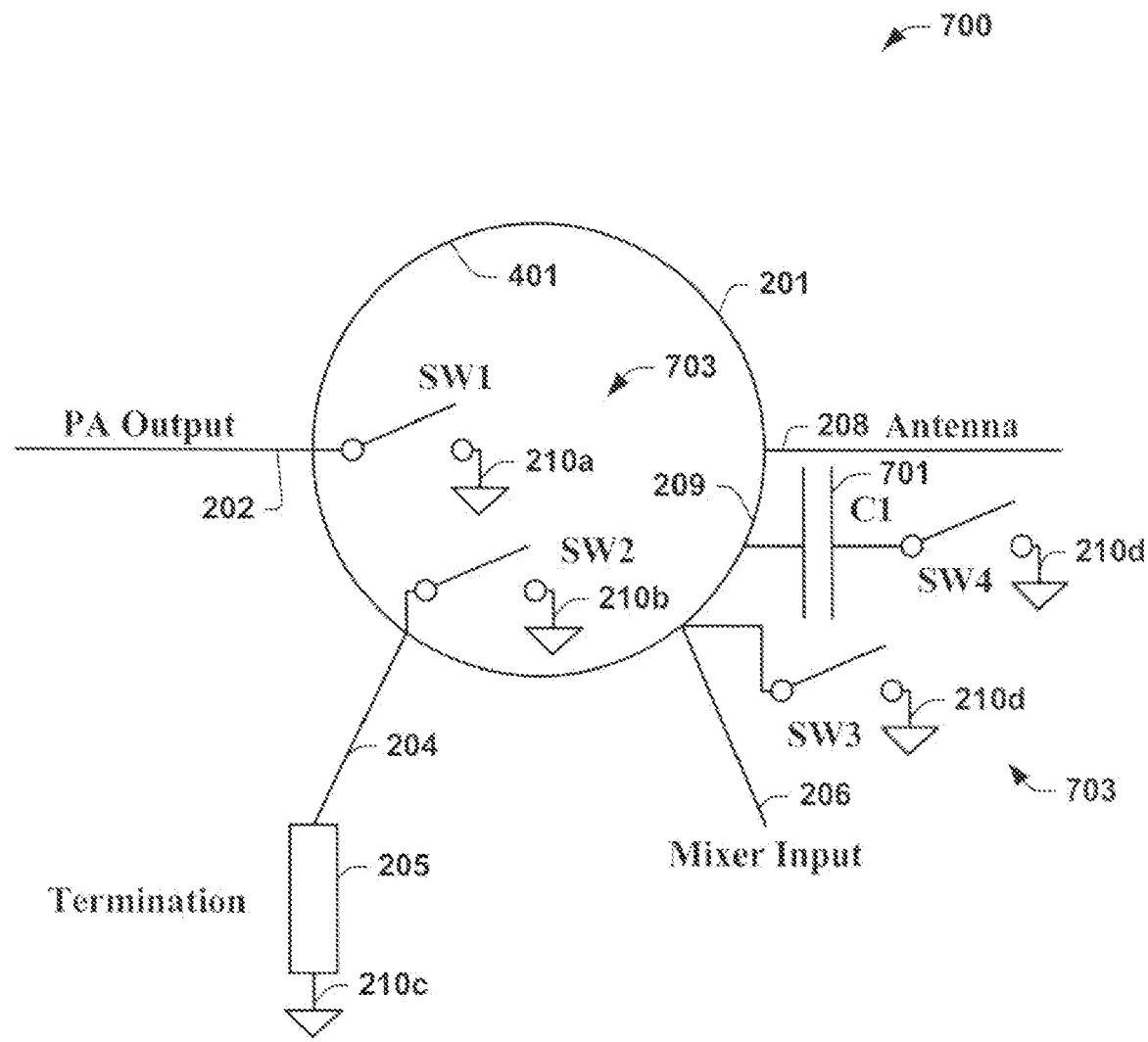
FIG. 7 is a simplified schematic diagram of a multi-port reconfigurable coupler in accordance with a fourth embodiment of the invention.

FIG. 7 illustrates an exemplary multi-port reconfigurable coupler 700 utilizing a coupling device 201 and a switching system 703 comprising one or more switching components (e.g., switches SW1, SW2, SW3 and SW4) for reconfiguring the coupling device 201 in one of a transmit-receive mode (TRX), an improved transmit-only (TX) mode or an improved receive-only (RX) mode, and having improved RX line insertion losses, in accordance with a fourth embodiment of the invention. Accordingly, the fourth embodiment has the configuration flexibility and advantages mentioned above for the third embodiment 600 of FIG. 6 and additionally the improved, reduced RX line insertion losses provided by a capacitor C1 701 made configurable by switch SW4.

In particular, the fourth embodiment of the multi-port reconfigurable coupler 700, comprises a transmit (TX) signal port 202, for example, supplied by a power amplifier (PA)

output, a termination port 204 typically connected to a suitable termination 205 such as a resistor coupled, for example, to a common or ground source 210c, a receive (RX) signal port 206, for example, typically feeding a mixer input, and an antenna port 208 connected to an antenna, for example.

Switching system 703 comprises the switch SW1 connected to the coupling device 201 at the TX signal port 202, the switch SW2 connected to the coupling device 201 at the termination port 204, and the switch SW3 connected to the coupling device 201 at the RX signal port 206. The switching component SW1 is configured to couple the TX signal port 202 to a transmit potential 210a, the switching component SW2 is configured to couple the termination port 204 to a termination potential 210b, and switching component SW3 is configured to couple the RX signal port 206 to a receive potential 210d.

Additionally, the multi-port reconfigurable coupler 700 further comprises a capacitor C1 701 connected to the coupling device 201 along the coupler receive segment 209 between antenna port 208 and the mixer input at the receive signal port 206. Capacitor C1 701 is arranged in series with switch SW4, and is configured to be coupled to a first capacitance potential 210d. The switched series capacitor C1 improves the insertion loss by permitting an adjustment of the high impedance receive line segment 209 between the antenna port 208 and mixer input at the receive signal port 206. Due to the nature of a rat-race coupler, this line impedance may be represented as:

Line impedance=$\sqrt{(2)} \cdot Z0$.

Switches SW1, SW2 and SW4 are closed (with SW3 open) for the RX-only mode, providing an improved low insertion loss RX mode.

Switches SW2 and SW3 are closed (with SW1 and SW4 open) for the improved TX-only mode, and as before, all switches SW1-SW4 are open for the TRX mode. Optionally, SW3 could be omitted to provide an alternate extension to the first embodiment 200 of FIG. 2.

Figure 8:
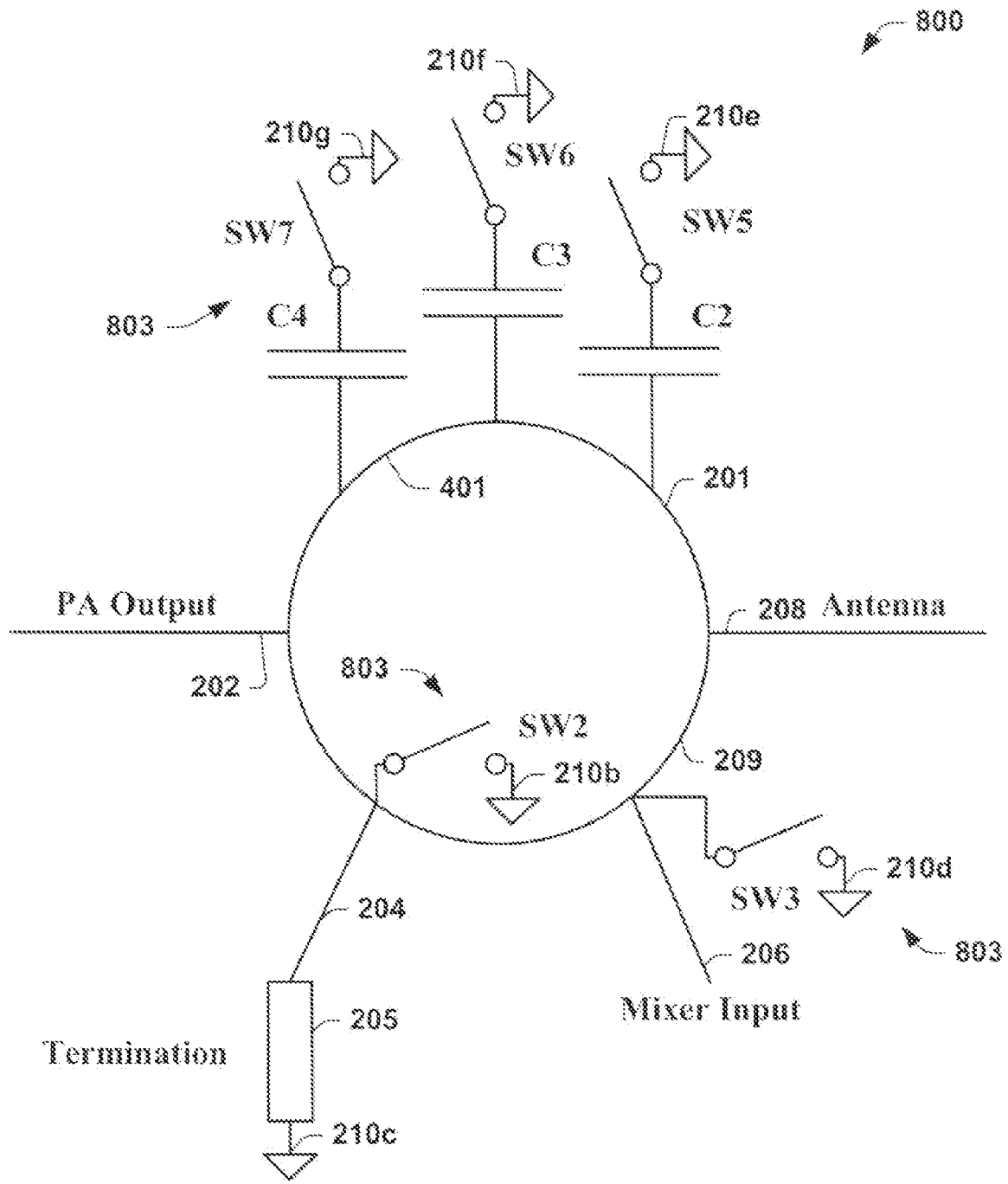
FIG. 8 is a simplified schematic diagram of a multi-port reconfigurable coupler in accordance with a fifth embodiment of the invention.

FIG. 8 illustrates an exemplary multi-port reconfigurable coupler 800 utilizing a coupling device 201 and a switching system 803 comprising one or more switching components (e.g., switches SW2-SW7) for reconfiguring the coupling device 201 in one of a transmit-receive mode (TRX) or an improved transmit-only mode (TX), and for providing improved, reduced TX line insertion losses, in accordance with a fifth embodiment of the invention. Accordingly, the fifth embodiment has the configuration flexibility and advantages mentioned above for the second embodiment 400 of FIG. 4 and additionally the improved TX line insertion losses provided by capacitors C2, C3 and C4 made configurable by switches SW5, SW6 and SW7, respectively.

In particular, the fifth embodiment of the multi-port reconfigurable coupler 800, as with the other couplers previously described, comprises a transmit (TX) signal port 202, for example, supplied by a power amplifier (PA) output, a termination port 204 typically connected to a suitable termination 205 such as a resistor coupled, for example, to a common or ground source 210c, a receive (RX) signal port 206, for example, typically feeding a mixer input, and an antenna port 208 connected to an antenna, for example.

Switching system 803 comprises the switch SW2 connected to the coupling device 201 at the termination port 204, and the switch SW3 connected to the coupling device 201 at the RX signal port 206. The switch SW2 is configured to couple the termination port 204 to a termination potential 210b, and switch SW3 is configured to couple the RX signal port 206 to a receive potential 210d.

Additionally, the multi-port reconfigurable coupler 800 further comprises capacitors C2, C3 and C4 connected to the coupling device 201 along the coupler transmit line segment 401 (e.g., equally spaced) between the PA output at the TX signal port 202 and the antenna port 208. Capacitors C2, C3 and C4 are arranged in series with switches SW5, SW6 and SW7, respectively, and are configured to be coupled to second, third and fourth capacitance potentials 210e, 210f, 210g, respectively. The switched series capacitors C2, C3 and C4 are used to reduce the insertion loss of the high impedance coupler transmit line segment 401 between the PA output at the TX signal port 202 and the antenna port 208 that remains when SW2 and SW3 are closed.

Switches SW2 and SW3 are closed for the improved TX-only mode, and switches SW5, SW6 and SW7 are also closed when desired (or a combination thereof) along with switches SW2 and SW3 to improve the insertion loss of the high impedance coupler transmit line segment 401.

All switches SW2-SW7 are open for the TRX mode.

Figure 9:
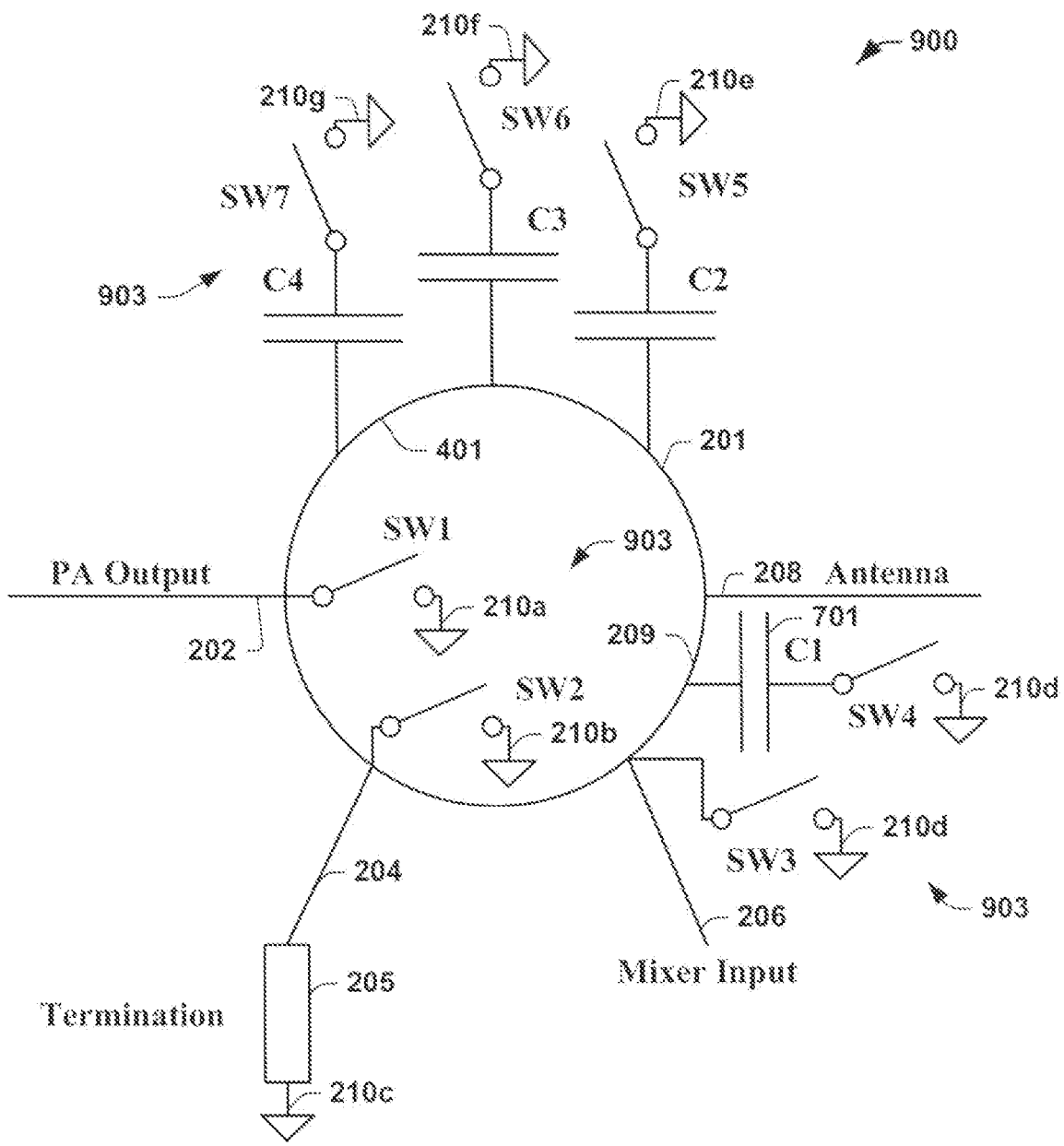
FIG. 9 is a simplified schematic diagram of a multi-port reconfigurable coupler in accordance with a sixth embodiment of the invention.

FIG. 9 illustrates an exemplary multi-port reconfigurable coupler 900 utilizing a coupling device 201 and a switching system 903 comprising one or more switching components (e.g., switches SW1-SW7) for reconfiguring the coupling device 201 in one of a transmit-receive mode (TRX), an improved transmit-only mode (TX) or an improved receive-only mode (RX), and for improving TX and RX line insertion losses, in accordance with a sixth embodiment of the invention. Accordingly, the sixth embodiment has the configuration flexibility and advantages mentioned above for the fourth embodiment 700 of FIG. 7 together with the improved TX and RX line insertion losses provided by capacitors C2, C3 and C4 made configurable by switches SW5, SW6 and SW7, respectively.

In particular, the sixth embodiment of the multi-port reconfigurable coupler 900, as with the other couplers previously described, comprises a transmit (TX) signal port 202, for example, supplied by a power amplifier (PA) output, a termination port 204 typically connected to a suitable termination 205 such as a resistor coupled, for example, to a common or ground source 210c, a receive (RX) signal port 206, for example, typically feeding a mixer input, and an antenna port 208 connected to an antenna, for example.

Switching system 903 comprises the switch SW1 connected to the coupling device 201 at the TX signal port 202, the switch SW2 connected to the coupling device 201 at the termination port 204, and the switch SW3 connected to the coupling device 201 at the RX signal port 206. The switch SW1 is configured to couple the TX signal port 202 to a transmit potential 210a, the switch SW2 is configured to couple the termination port 204 to a termination potential 210b, and switch SW3 is configured to couple the RX signal port 206 to a receive potential 210d.

Further, the multi-port reconfigurable coupler 900 comprises a capacitor C1 701 connected to the coupling device 201 along the coupler receive segment 209 between antenna port 208 and the mixer input at the receive signal port 206. Capacitor C1 701 is arranged in series with switch SW4, and is configured to be coupled to a first capacitance potential 210d. The switched series capacitor C1 improves the insertion loss by permitting an adjustment of the high impedance receive line segment 209 between the antenna port 208 and mixer input at the receive signal port 206.

Switches SW1, SW2 and SW4 are closed for the RX-only mode, providing an improved low insertion loss RX mode.

Additionally, the multi-port reconfigurable coupler 900 further comprises capacitors C2, C3 and C4 connected to the coupling device 201 along the coupler transmit line segment 401 (e.g., equally spaced) between the PA output at the TX signal port 202 and the antenna port 208. Capacitors C2, C3 and C4 are arranged in series with switches SW5, SW6 and SW7, respectively, and are configured to be coupled to second, third and fourth capacitance potentials 210e, 210f, 210g, respectively. The switched series capacitors C2, C3 and C4 are used to improve the insertion loss of the high impedance coupler transmit line segment 401 between the PA output at the TX signal port 202 and the antenna port 208 that remains when switches SW2 and SW3 are closed.

Switches SW2 and SW3 are closed for the improved TX-only mode, and switches SW5, SW6 and SW7 are also closed when desired along with switches SW2 and SW3 to improve the insertion loss of the high impedance coupler transmit line segment 401.

As before, all switches SW1-SW7 are open for the TRX mode.

Figures 10, 11:
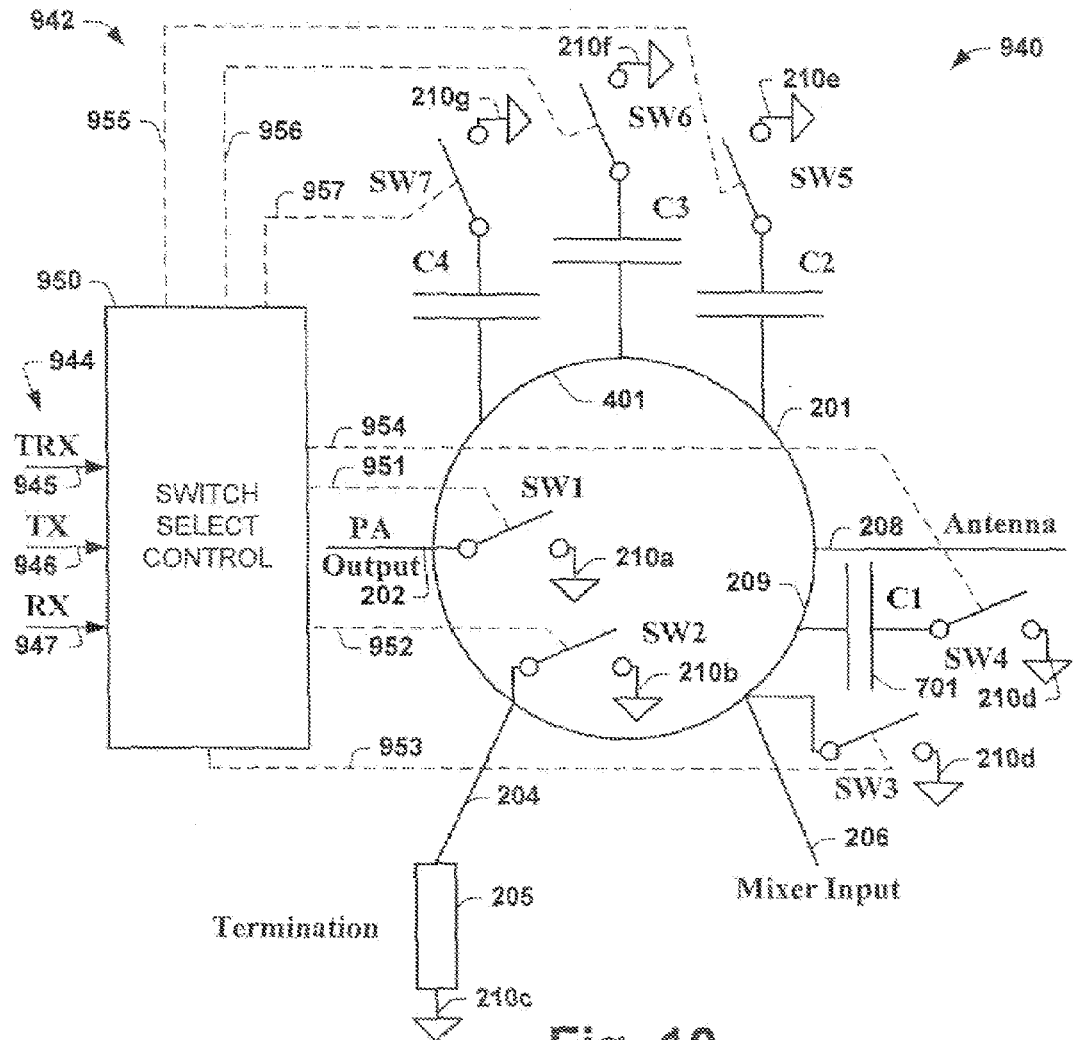
FIG. 10 is a simplified schematic diagram of one embodiment of the multi-port reconfigurable coupler of FIG. 9 in accordance with several aspects of the present invention.
FIG. 11 is a table of the TRX, TX and RX modes and functions selectable by the switches of the switching system of the multi-port reconfigurable couplers of FIGS. 9 and 10 according to one embodiment.

FIG. 10 illustrates a seventh exemplary embodiment of a multi-port reconfigurable coupler 940 similar to that of FIG. 9, utilizing a coupling device 201 and a switching system 942 for reconfiguring the coupling device 201 in one of a transmit-receive mode (TRX), an improved transmit-only mode (TX) or an improved receive-only mode (RX), based on one or more mode select signals 944, in accordance with several aspects of the present invention.

FIG. 11 illustrates a table 970 of the TRX 973, TX 974 and RX 975 modes and functions 971 selectable by the configuration switches (e.g., switches SW1-SW7) 972 of the switching system 903 or 942 of the multi-port reconfigurable coupler 900 of FIG. 9 or 940 of FIG. 10, respectively.

In particular, the seventh embodiment of the multi-port reconfigurable coupler 940 of FIG. 10, as with the other previously described couplers, comprises a transmit (TX) signal port 202, for example, supplied by a power amplifier (PA) output, a termination port 204 typically connected to a suitable termination 205 such as a resistor coupled, for example, to a common or ground source 210c, a receive (RX) signal port 206, for example, typically feeding a mixer input, and an antenna port 208 connected to an antenna, for example.

Switching system 942 comprises a switch select control 950 configured to receive one or more mode select signals 944 and to select one or more of the configuration switches SW1-SW7 (972) via select lines 951-957, respectively, based upon information from the one or more mode select signals 944 indicating a transmit-receive TRX mode 945, a transmit-only TX mode 946, or a receive-only RX mode 947.

The switch select control 950 of switching system 942, is configured to select and couple: switch SW1 connected to the coupling device 201 at the TX signal port 202 to a transmit potential 210a, switch SW2 connected to the coupling device 201 at the termination port 204 to a termination potential 210b, and the switch SW3 connected to the coupling device 201 at the RX signal port 206 to a receive potential 210d.

Switch select control 950 is further configured to select and couple switch SW4 in series with capacitor C1 connected along receive line segment 209 of the coupling device 201 to a first capacitance potential 210d improves the insertion loss by permitting an adjustment of the high impedance receive line segment 209 between the antenna port 208 and mixer input at the receive signal port 206. Switch select control 950 is also configured to select and couple switches SW5, SW6, and SW7 connected in series with capacitors C2, C3, and C4, respectively, to second, third and fourth capacitance potentials 210e, 210f, 210g, respectively, to improve the insertion loss of the high impedance coupler transmit line segment 401 between the PA output at the TX signal port 202 and the antenna port 208.

It will be appreciated by those skilled in the art that the individual potentials 210a-210g described above may be separate potentials, the same potential, or they may be any combination or groupings of these or other such potentials.

Although a four-port hybrid coupling device 201 is illustrated and described herein in the context of a multi-port reconfigurable coupler, any other number of ports of any type of coupler, including a rat-race coupler, a 180° coupler, or any combination thereof, for example, is also contemplated within the scope of the present invention.

In one embodiment of the invention, a method for efficiently transmitting and receiving microwave signals is disclosed herein using a multi-port reconfigurable coupler (e.g., 940 of FIG. 10) having a switching system (e.g., 942) configured to selectively couple one or more of a transmit signal port 201, an antenna port 208, a receive signal port 206 or a termination port 204 to a predetermined potential (e.g., 210a-210g) based on information indicating a transmit-receive TRX mode 945, a transmit only TX mode 946, or a receive only RX mode 947.

For example, the method comprises coupling the receive signal port 206 and the termination port 204 to the predetermined potential (e.g., 210a-210g) based on information indicating the transmit only TX mode 946, coupling the transmit signal port 202 and the termination port 204 to the predetermined potential (e.g., 210a-210g) based on information indicating the receive only RX mode 947, and decoupling the transmit signal port 202, the receive signal port 206 and the termination port 204 from the predetermined potential (e.g., 210a-210g) based on information (e.g., 944) indicating the transmit-receive TRX mode 945.

The method may further comprise coupling substantially all the power received at a transmit signal port 202 to an antenna port 208 based on information (e.g., 944) indicating the transmit only TX mode 946, or coupling substantially all the power received at the antenna port 208 to a receive signal port 206 based on information indicating the receive only RX mode 947.

The method may also comprise dissipating a percentage of the power received at the transmit signal port 202 at a termination element 205 coupled to a termination port 204 and to pass a percentage of the power (e.g., about 50%) received at the transmit signal port 202 to the antenna port 208 based on information (e.g., 944) indicating the transmit-receive TRX mode 945, and dissipating a percentage (e.g., about 50%) of the power received at the antenna port in the transmit signal port 202 and to pass a percentage (e.g., about 50%) of the power received at the antenna port 208 to the receive signal port 206 based on information (e.g., 944) indicating the transmit-receive TRX mode 945.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A multi-port reconfigurable coupler, comprising:
   a transmit signal port;
   a termination port;
   a receive signal port;
   an antenna port; and
   a switching system configured to selectively couple the termination port to a predetermined termination potential based on information indicating one of a transmit only mode and a receive only mode, and to decouple based on information indicating a transmit-receive mode.

2. The multi-port reconfigurable coupler of claim 1, wherein the switching system is further configured to couple the transmit signal port to a predetermined transmit potential in the receive only mode, and to couple the receive signal port to a predetermined receive potential in the transmit only mode.

3. The multi-port reconfigurable coupler of claim 2, wherein the switching system is configured to couple the termination port to the predetermined termination potential in both the transmit only mode and the receive only mode.

4. The multi-port reconfigurable coupler of claim 3, wherein the predetermined transmit potential, the predetermined receive potential and the predetermined termination potential are all the same potential.

5. The multi-port reconfigurable coupler of claim 3, wherein the switching system is further configured to decouple the transmit signal port from the predetermined transmit potential, the receive signal port from the predetermined receive potential and the termination port from the predetermined termination potential in the transmit-receive mode.

6. The multi-port reconfigurable coupler of claim 3, wherein the switching system is further configured to couple a first capacitance, located along a line between the antenna port and the receive signal port, to a predetermined first capacitance potential in the receive only mode.

7. The multi-port reconfigurable coupler of claim 6, wherein the switching system is further configured to couple one or more of a second, third and forth capacitance located along a line between the transmit signal port and the antenna port to respective predetermined second, third and forth capacitance potentials in the transmit only mode.

8. The multi-port reconfigurable coupler of claim 3, wherein the switching system is further configured to couple one or more of a second, third and forth capacitance located along a line between the transmit signal port and the antenna port to respective predetermined second, third and forth capacitance potentials in the transmit only mode.

9. The multi-port reconfigurable coupler of claim 1, wherein the switching system is configured to dissipate a percentage of power received at the transmit signal port at a termination element coupled to the termination port in the transmit-receive mode, and further configured to pass substantially all the power received at the antenna port to the receive signal port in the receive only mode.

10. The multi-port reconfigurable coupler of claim 1, wherein the switching system comprises one or more microwave capable transistors disposed on a die with the multi-port reconfigurable coupler, the microwave capable transistors configured to affect at least one of the following coupling arrangements:
    the termination port to the predetermined termination potential,
    the transmit signal port to a predetermined transmit potential,
    the receive signal port to a predetermined receive potential,
    a first capacitance located along a line between the antenna port and the receive signal port to a predetermined first capacitance potential, and
    one or more of a second, third and forth capacitance located along the high impedance line between the transmit signal port and the antenna port to respective predetermined second, third and forth capacitance potentials.

11. A multi-port reconfigurable coupler, comprising:
    a coupling device disposed on a semiconductor substrate and configured to separate transmit and receive signals, the coupling device comprising:
       a transmit signal port;
       a termination port;
       a receive signal port;
       an antenna port; and
       a switching system comprising one or more switching devices disposed on the semiconductor with the coupling device, the switching system configured to selectively couple the termination port to a predetermined termination potential by one or more of the switching devices based on information indicating one of a transmit only mode and a receive only mode, and to decouple based on information indicating a transmit-receive mode.

12. The coupler of claim 11, wherein the switching system is further configured
    to couple the receive signal port and the termination port to the predetermined potential based on information indicating the transmit only mode,
    to couple the transmit signal port and the termination port to the predetermined potential based on information indicating the receive only mode, and
    to decouple the transmit signal port, the receive signal port and the termination port from the predetermined potential based on information indicating the transmit-receive mode.

13. A coupler, comprising:
    coupling means operable
       to couple substantially all the power received at a transmit signal port to an antenna port in a transmit only mode,
       to couple substantially all the power received at the antenna port to a receive signal port in a receive only mode,
       to dissipate a percentage of the power received at the transmit signal port at a termination element coupled to a termination port and to pass a percentage of the power received at the transmit signal port to the antenna port in a transmit-receive mode, and
       to dissipate a percentage of the power received at the antenna port in the transmit signal port and to pass a percentage of the power received at the antenna port to the receive signal port in the transmit-receive mode; and
    switching means operable to reconfigure the coupling means by selectively coupling one or more of the transmit signal port, the antenna port, the receive signal port and the termination port to a predetermined potential based on information indicating one of the transmit-receive mode, the transmit only mode, and the receive only mode.

14. The coupler of claim 13, wherein the switching means is further configured to couple the receive signal port and the termination port to the predetermined potential in the transmit only mode.

15. The coupler of claim 13, wherein the switching means is further configured to couple the transmit signal port and the termination port to the predetermined potential in the receive only mode.

16. The coupler of claim 13, wherein the switching means is further configured to decouple the transmit signal port, the receive signal port and the termination port from the predetermined potential in the transmit-receive mode.

17. The coupler of claim 13, wherein the switching means is further configured to couple a first capacitance located along a line between the antenna port and the receive signal port to the predetermined potential in the receive only mode.

18. The coupler of claim 13, wherein the switching means is further configured to couple one or more of a second, third and forth capacitance located along a line between the transmit signal port and the antenna port to the predetermined potential in the transmit only mode.

19. The coupler of claim 13, wherein the switching means comprises one or more switching devices disposed on the same die with the coupler means, the switching devices configured to couple one or more of the termination port, the transmit signal port, the receive signal port, a first capacitance located along a line between the antenna port and the receive signal port, and one or more of a second, third and forth capacitance located along a line between the transmit signal port and the antenna port to the predetermined potential.

20. A method for transmitting and receiving signals using a multi-port reconfigurable coupler, the method comprising:

coupling a receive signal port and a termination port to a predetermined potential based on information indicating a transmit only mode;

coupling a transmit signal port and the termination port to the predetermined potential based on information indicating a receive only mode; and decoupling the transmit signal port, the receive signal port and the termination port from the predetermined potential based on information indicating a transmit-receive mode.

21. The method of claim 20, further comprising coupling substantially all the power received at the transmit signal port to the antenna port in the transmit only mode.

22. The method of claim 20, further comprising coupling substantially all the power received at the antenna port to the receive signal port in the receive only mode.

23. The method of claim 20, further comprising dissipating a percentage of the power received at the transmit signal port at a termination element coupled to the termination port and passing a percentage of the power received at the transmit signal port to the antenna port in the transmit-receive mode; and dissipating a percentage of the power received at the antenna port in the transmit signal port and passing a percentage of the power received at the antenna port to the receive signal port in the transmit-receive mode.

24. The method of claim 20, further comprising coupling a first capacitance located along a line between the antenna port and the receive signal port to the predetermined potential in the receive only mode.

25. The method of claim 20, further comprising coupling one or more of a second, third and forth capacitance located along a line between the transmit signal port and the antenna port to the predetermined potential in the transmit only mode.

* * * * *